ELECTRONIC CIRCUIT CRYSTAL CONTROLLED TRANSISTOR OSCILLATOR MULTIPLIER CIRCUIT
Filed April 6, 1964
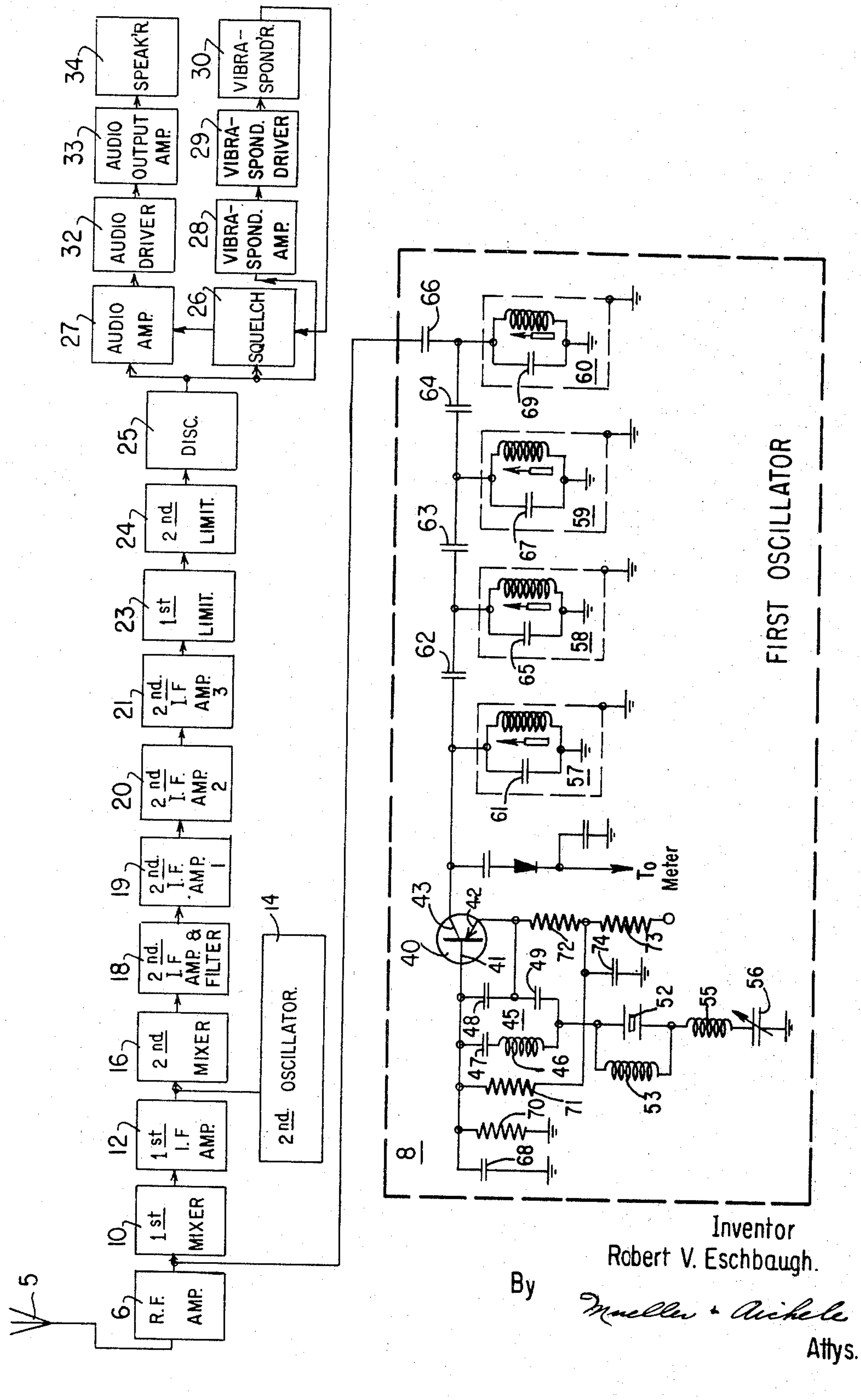
Inventor
Robert V. Eschbaugh.
By Mueller & Aichele
Attys.

United States Patent Office 3,345,573

Patented Oct. 3, 1967

3,345,573

ELECTRONIC CIRCUIT CRYSTAL CONTROLLED TRANSISTOR OSCILLATOR MULTIPLIER CIRCUIT

Robert V. Eschbaugh, Hillside, Ill., assignor to Motorola, Inc., Franklin Park, Ill., a corporation of Illinois Filed Apr. 6, 1964, Ser. No. 357,354

6 Claims. (Cl. 325—438)

This invention relates to oscillator circuits, and in particular to a crystal controlled oscillator and multiplier circuit incorporating a single transistor.

Oscillators used in electronic circuits often incorporate crystals as the frequency determining element in order to achieve the necessary degree of stability and accuracy. However, because of the physical limitations of crystals, the frequencies obtainable from a crystal controlled oscillator are often lower than the desired frequency. In this case it is necessary to use frequency multiplier circuits to increase the frequency of the signal from the oscillator.

Crystal controlled oscillator and frequency multiplier circuits have been designed which contain only one vacuum tube. This has been possible because vacuum tubes have high impedances between elements and use of selected elements in a multi-element tube provides good isolation between the oscillator and its load, or multiplier portion of the tube. However, it is desired to use transistors in such circuits because of smaller size and greater reliability, and transistors are inherently low impedance devices with a limited number of elements. This makes it difficult to isolate the frequency determining portions of the oscillator from the load. In order to achieve the proper degree of isolation between the load and the oscillator so that the stability and accuracy of the oscillator will not be affected by the load, it has been necessary to use transistor multiplier and puffer stages between the oscillator and the load.

It is, therefore, an object of this invention to provide an improved crystal controlled transistor oscillator.

Another object is to provide a stable, accurate crystal controlled oscillator and multiplier circuit using only one transistor.

A feature of this invention is the provision of a crystal controlled transistor oscillator multiplier circuit with effectively separate paths for the circulation of the fundamental oscillator frequency and the desired output harmonic frequency to thereby isolate the output from the oscillator.

Another feature of the invention is the provision of a transistor oscillator having a frequency determining circuit coupled to the base and emitter electrodes, and a harmonic frequency circuit coupled to said collector electrode, with said harmonic frequency circuit presenting a low impedance at the fundamental frequency, and a bypass about said frequency determining circuit having low impedance at the harmonic frequency.

The invention is illustrated in the partial schematic and block diagram showing a single transistor oscillator multiplier circuit used as a local oscillator for a receiver.

In practicing this invention a crystal controlled oscillator multiplier circuit having a single transistor is provided which may be used as the local oscillator of a carrier wave receiver. A tuned load having a high output impedance at the desired output frequency and a low impedance at the oscillator frequency, is coupled to the output of the transistor. A frequency determining circuit including a crystal is coupled to the transistor input to provide proper feedback for oscillation at the crystal frequency. A capacitor coupled across the frequency determining network provides a low impedance path for the output harmonic frequency of the oscillator multiplier circuit to couple the output harmonic signal back to the transistor input. Thus the fundamental oscillator signal frequency and the output signal at a harmonic frequency are effectively isolated, reducing the effect of the load variations on the oscillator and eliminating the need for buffer amplifiers.

The invention is illustrated in the partial schematic and partial block diagram. Carrier wave signals are received by an antenna 5 and amplified in radio frequency amplifier 6. The output signal from oscillator 8 is mixed with the carrier wave signal in first mixer 10 to develop a first intermediate frequency signal which is further amplified in first intermediate frequency amplifier 12. A second local oscillator signal is generated in second oscillator 14 and mixed with the output of first intermediate frequency amplifier 12 in second mixer 16 to develop a second intermediate frequency signal. The second intermediate frequency signal is further amplified in second intermediate frequency amplifier and filter 18 and intermediate frequency amplifiers 19, 20 and 21. The output signal from intermediate frequency amplifier 21 is limited in first and second limiters 23 and 24 and the information contained in the signal is detected in discriminator 25. The output of discriminator 25 is applied to squelch circuit 26, audio amplifier 27 and the vibrasponder amplifier 28. The output of vibrasponder amplifier 28 is further amplified in vibrasponder driver 29 and detected in vibrasponder 30. In addition to a voice signal an audio tone is transmitted to the receiver. When a particular tone corresponding to the receiver is received, the vibrasponder circuit detects the tone and actuates the squelch circuit 26 turning on audio amplifier 27. Thus audio amplifier 27 is operative only when a signal is received which is designated as being for this particular receiver. The output of audio amplifier 27 is further amplified in audio driver 32 and audio output amplifier 33. The olutput of audio amplifier 33 is applied to a speaker or earphones 34.

First oscillator 8, consists of a single transistor oscillator multiplier circuit. The frequency determining network of the oscillator consists of parallel resonant circuit 45 coupled in series with crystal 52 and a series resonant circuit including inductor 55 and capacitor 56. This series resonant circuit allows a fine adjustment of the oscillator frequency and thereby compensates for manufacturing tolerances on crystal frequency, and inductance 53 compensates for the holder capacitance of crystal 52. Parallel resonant circuit 45 includes inductor 46 coupled in parallel with a capacitor divider network consisting of capacitors 47, 48 and 49. The junction of capacitors 47 and 48 is coupled to base 41 of transistor 40, and the junction of capacitors 48 and 49 is coupled to emitter 42 of transistor 40. Collector 43 of transistor 40 is coupled to parallel resonant circuits 57, 58, 59 and 60 through capacitors 62, 63, and 64. The output signal from the first oscillator 8 is coupled to first mixer 10 through capacitor 66. A bypass capacitor 68 is coupled between base 41 of transistor 40 and ground. Resistors 70 and 71 form a bias network for base 41 of transistor 40, and resistor 72 applies bias to the emitter 42. Transistor 40 is coupled to the power supply through a decoupling network consisting of resistor 73 and capacitor 74. Capacitors 48 and 68 provide a means of minimizing the effect on the output frequency of transistor 40 parameter changes with voltage and temperature, capacitor 48 being connected across the base 41, emitter 42 junction and capacitor 68 effectively (at the crystal frequency) being connected across the base 41 collector 43 junction. Further isolation of transistor 40 from the frequency determining elements is realized because capacitors 47, 48 and 49 provide a capacitive divider which is part of parallel resonant circuit 45 tuned to the fundamental oscillator frequency. Capacitor 47 is the smallest and thus determines the basic frequency of parallel resonant circuit 45 while the effect of transistor 40 parameter changes are minimized by capacitors 48 and 49.

In operation, crystal 52 and parallel resonant circuit 45 are resonant at the fundamental frequency of the oscillator and form the frequency determining circuit. Feedback is applied from the junction of capacitors 48 and 49 of the circuit 45 to the emitter 42. Parallel resonant circuits 57, 58, 59 and 60 are tuned to resonance at the desired output frequency, which is a harmonic of the fundamental frequency of the oscillator. Parallel resonant circuit 57 has a low impedance at the fundament frequency of the oscillator and thus for a signal at the fundamental frequency, collector 43 is effectively coupled to ground. Since collector 43 is effectively connected to ground at the fundamental frequency of the oscillator, variations in the load coupled to the oscillator have no appreciable effect on the accuracy and stability of the oscillator. The output signal, which has a frequency equal to a harmonic of the fundamental frequency, is developed across tuned circuits 57, 58, 59 and 60 which present a high impedance to signals of this frequency. The output signal is coupled to first mixer 10 through capacitor 66. Capacitor 68 is chosen to present a low impedance at the desired output harmonic frequency to bypass the frequency determining circuit of the oscillator for this frequency.

In a system of practical construction operative as previously described, circuit component values were as set forth below. It is pointed out that these values are not to be considered as limiting and other values can be used.

| | | |
|---|---|---|
| Transistor **40** | | M9134 |
| Capacitor **47** | picofarads | 12 |
| Capacitor **48** | do | 18 |
| Capacitor **49** | do | 56 |
| Inductor **53** | microhenries | 2.6 |
| Inductor **55** | do | 2.2 |
| Capacitor **56** | picofarads | 3 to 12 |
| Capacitor **61** | do | 18 |
| Capacitor **62** | picofarad | 0.56 |
| Capacitor **63** | do | 0.39 |
| Capacitor **64** | do | 0.62 |
| Capacitor **65** | picofarads | 6.8 |
| Capacitor **66** | do | 4 |
| Capacitor **67** | do | 6.8 |
| Capacitor **68** | do | 15 |
| Capacitor **69** | do | 3 |
| Resistor **70** | ohms | 3300 |
| Resistor **71** | do | 2200 |
| Resistor **73** | do | 330 |
| Capacitor **74** | microfarad | .01 |

Thus a simple single transistor oscillator multiplier circuit has been shown which will provide an output frequency at a harmonic of a crystal frequency used to control the frequency, and which uses only one transistor. The oscillator shown has the stability and accuracy of a crystal oscillator coupled to independent multiplier stages, but uses fewer components to achieve this result.

What is claimed is:

1. A single transistor oscillator-multiplier circuit including in combination, a transistor having base, emitter and collector electrodes, frequency determining means having a resonant frequency coupled between said base electrode and a reference potential, said frequency determining means having a portion coupled to said emitter electrode to provide feedback thereto, capacitor means coupled between said base electrode and said reference potential, tuned circuit means coupled between said collector electrode and said reference potential and having a low impedance at said resonant frequency so that said collector electrode is effectively connected directly to said reference potential with respect to said resonant frequency, said transistor, said frequency determining means, and said tuned circuit means forming an oscillator circuit providing an output signal containing frequencies equal to said resonant frequency and harmonics thereof, said tuned circuit means being resonant at a predetermined harmonic frequency of said resonant frequency whereby a signal having a frequency equal to said predetermined harmonic frequency is developed across said tuned circuit means, said capacitor means providing a low impedance path to said base electrode for said predetermined harmonic frequency signal.

2. A single transistor oscillator-multiplier circuit including in combination, a transistor having base, emitter and collector electrodes, frequency determining means coupled between said base electrode and a reference potential and including first capacitor means, inductance means and crystal means, said first capacitor means being coupled to the emitter electrode of said transistor to provide feedback for producing oscillations at a predetermined frequency, second capacitor means coupled between said base electrode and said reference potential, tuned circuit means coupled between said collector electrode and said reference potential, said tuned circuit means having a low impedance at said predetermined frequency whereby said collector electrode is effectively connected directly to said reference potential with respect to said predetermined frequency, said transistor, said frequency determining means, and said tuned circuit means forming an oscillator circuit having an output signal containing frequencies equal to said predetermined frequency and harmonics thereof, said tuned circuit means being resonant at a given harmonic frequency of said predetermined frequency whereby a signal having a frequency equal to said given harmonic frequency is developed across said tuned circuit means, said second capacitor means providing a low impedance path to said base electrode for said given harmonic frequency signal.

3. In a carrier wave receiver including a first portion for receiving the carrier wave and having mixer means for heterodyning the carrier wave with a local oscillator signal to develop an intermediate frequency signal, a second receiver portion coupled to the mixer means for translating the intermediate frequency signal, and single transistor oscillator multiplier circuit for supplying the local oscillator signal coupled to the mixer means and including in combination, a transistor having base, emitter and collector electrodes, frequency determining means having a resonant frequency coupled between said base electrode and a reference potential, said frequency determining means having a portion coupled to said emitter electrode to provide feedback thereto, capacitor means coupled between said base electrodes and said reference potential, tuned circuit means coupled between said collector electrode and said reference potential and having a low impedance at said resonant frequency so that said collector electrode is effectively connected directly to said reference potential with respect to said resonant frequency, said transistor, said frequency determining means, and said tuned circuit means forming an oscillator circuit providing an output signal containing frequencies equal to said resonant frequency and harmonics thereof, said tuned circuit means being resonant at a predetermined harmonic frequency of said resonant frequency whereby a signal having a frequency equal to said predetermined harmonic frequency is developed across said tuned circuit means, said capacitor means providing a low impedance path to said base electrode for said predetermined harmonic frequency signal.

4. A single transistor oscillator-multiplier circuit including in combination, a transistor having base, emitter and collector electrodes, a first parallel resonant circuit tuned to a predetermined resonant frequency and including a capacitor divider coupled to said base electrode, said capacitor divider being coupled to said emitter electrode to provide feedback, a series resonant circuit including crystal means coupled from said first parallel resonant circuit to a reference potential, capacitor means coupled between said base electrode and said reference potential, tuned circuit means including a plurality of second parallel resonant circuits coupled between said collector electrode and said reference potential, said tuned circuit means having a low impedance at said predetermined resonant frequency whereby said collector electrode is effectively connected directly to said reference potential with respect to said resonant frequency, said first parallel resonant circuit, said series resonant circuit, said transistor and said tuned circuit means forming an oscillator circuit providing an output signal containing frequencies equal to said resonant frequency and harmonic frequencies thereof, each of said second parallel resonant circuits being tuned to the same one of said harmonic frequencies whereby a signal having a frequency equal to said one harmonic frequency is developed across said tuned circuit means, said capacitor means providing a low impedance path for said one harmonic frequency.

5. In a carrier wave receiver including a first portion for receiving the carrier wave and having mixer means for heterodyning the carrier wave with a local oscillator signal to develop an intermediate frequency signal, a second receiver portion coupled to the mixer means for translating the intermediate frequency signal and a single transistor osscillator-multiplier circuit for supplying the local oscillator signal coupled to the mixer means and including in combination, a transistor having base, emitter and collector electrodes, a first parallel resonant circuit tuned to a predetermined resonant frequency and including a capacitor divider coupled to said base electrode, said capacitor divider being coupled to said emitter electrode to provide feedback, a series resonant circuit including crystal means coupled from said first parallel resonant circuit to a reference potential, capacitor means coupled between said base electrode and said reference potential, tuned circuit means including a plurality of second parallel resonant circuits coupled between said collector electrode and said reference potential, said tuned circuit means having a low impedance at said predetermined resonant frequency whereby said collector electrode is effectively connected directly to said reference potential with respect to said resonant frequency, said first parallel resonant circuit, said series resonant circuit, said transistor and said tuned circuit means forming an oscillator circuit providing an output signal containing frequencies equal to said resonant frequency and harmonic frequencies thereof, each of said second parallel resonant circuits being tuned to the same one of said harmonic frequencies whereby a signal having a frequency equal to said one harmonic frequency is developed across said tuned circuit means, said capacitor means providing a low impedance path for said one harmonic frequency.

6. A single transistor oscillator-multiplier circuit including in combination, a transistor having base, emitter and collector electrodes, a first parallel resonant circuit tuned to a predetermined resonant frequency and including first, second and third capacitors connected in series, the junction of said first and second capacitors being coupled to said base electrode, the junction of said second and third capacitors being coupled to said emitter electrode to provide feedback, a series resonant circuit including crystal means coupled from said first parallel resonant circuit to a reference potential, capacitor means coupled between said base electrode and said reference potential, tuned circuit means including a plurality of second parallel resonant circuits coupled between said collector electrode and said reference potential, said tuned circuit means having a low impedance at said predetermined resonant frequency whereby said collector electrode is effectively connected directly to said reference potential with respect to said resonant frequency, said first parallel resonant circuit, said series resonant circuit, said transistor and said tuned circuit means forming an oscillator circuit providing an output signal containing frequencies equal to said resonant frequency and harmonic frequencies thereof, each of said second parallel resonant circuit being tuned to the same one of said harmonic frequencies whereby a signal having a frequency equal to said one harmonic frequency is developed across said tuned circuit means, said capacitor means providing a low impedance path for said one harmonic frequency.

No references cited.

KATHLEEN H. CLAFFY, *Primary Examiner.*

R. S. BELL, *Assistant Examiner.*